United States Patent
Huang et al.

(10) Patent No.: US 10,844,174 B2
(45) Date of Patent: Nov. 24, 2020

(54) LOW DIELECTRIC POLYIMIDE COMPOSITION, POLYIMIDE, POLYIMIDE FILM AND COPPER CLAD LAMINATE USING THE SAME

(71) Applicant: Zhen Ding Technology Co., Ltd., Taoyuan (TW)

(72) Inventors: Nan-Kun Huang, Taoyuan (TW); Shou-Jui Hsiang, Taoyuan (TW); Yu-Wen Kao, Taoyuan (TW); Szu-Hsiang Su, Taoyuan (TW)

(73) Assignee: Zhen Ding Technology Co., Ltd., Taoyuan (TW)

( * ) Notice: Subject to any disclaimer, the term of this patent is extended or adjusted under 35 U.S.C. 154(b) by 348 days.

(21) Appl. No.: 15/797,114

(22) Filed: Oct. 30, 2017

(65) Prior Publication Data

US 2019/0085131 A1 Mar. 21, 2019

(30) Foreign Application Priority Data

Sep. 19, 2017 (TW) ............... 106132092 A

(51) Int. Cl.
| | | |
|---|---|---|
| B32B 15/08 | (2006.01) | |
| B32B 15/20 | (2006.01) | |
| C08G 73/10 | (2006.01) | |
| H05K 1/03 | (2006.01) | |

(Continued)

(52) U.S. Cl.
CPC .......... *C08G 73/1078* (2013.01); *B32B 15/08* (2013.01); *B32B 15/20* (2013.01); *H05K 1/036* (2013.01); *H05K 3/022* (2013.01); *H05K 3/386* (2013.01); *B32B 2307/204* (2013.01); *B32B 2457/08* (2013.01); *H05K 1/0346* (2013.01);

(Continued)

(58) Field of Classification Search
CPC .... C08G 73/1078; H05K 3/386; H05K 1/036; H05K 3/022; H05K 1/0326; H05K 2201/0195; H05K 1/09; H05K 1/0346; H05K 2201/0154; B32B 15/08; B32B 15/20; B32B 2307/204; B32B 2457/08; B32B 2250/03; B32B 2255/26; B32B 2255/10; B32B 2307/748; B32B 2250/40; B32B 2307/206; B32B 27/281
See application file for complete search history.

(56) References Cited

U.S. PATENT DOCUMENTS

| | | | | |
|---|---|---|---|---|
| 6,740,371 B1 * | 5/2004 | Hosaka | ................. | C07C 217/90 428/1.2 |
| 2010/0255324 A1 * | 10/2010 | Yoo | ...................... | H05K 1/0346 428/458 |
| 2018/0244847 A1 * | 8/2018 | Matsumaru | ................. | C08J 5/18 |

FOREIGN PATENT DOCUMENTS

| | | | |
|---|---|---|---|
| JP | 2009215363 A | * | 9/2009 |
| TW | 201531498 A | | 8/2015 |
| TW | 201607972 A | | 3/2016 |

OTHER PUBLICATIONS

Machine translation of JP 2009215363. (Year: 2009).*

* cited by examiner

*Primary Examiner* — John D Freeman
(74) *Attorney, Agent, or Firm* — ScienBiziP, P.C.

(57) ABSTRACT

A low dielectric polyimide composition comprises an aliphatic anhydride, a long chain diamine, and an ester diamine. A polyimide made of such low dielectric polyimide composition has low polarizability group, thus the dielectric constant of the polyimide is lower. A polyimide made of the low dielectric polyimide composition, a polyimide film using the polyimide, and a copper clad laminate using the polyimide film are also provided.

1 Claim, 8 Drawing Sheets

(51) Int. Cl.
*H05K 3/02* (2006.01)
*H05K 3/38* (2006.01)
(52) U.S. Cl.
CPC ............... *H05K 2201/0154* (2013.01); *H05K 2201/0195* (2013.01)

LOW DIELECTRIC POLYIMIDE COMPOSITION, POLYIMIDE, POLYIMIDE FILM AND COPPER CLAD LAMINATE USING THE SAME

FIELD

The subject matter herein generally relates to a low dielectric polyimide composition, a polyimide made by the low dielectric polyimide composition, a polyimide film made by the polyimide, and a copper clad laminate using the polyimide film.

BACKGROUND

Printed circuit board (PCB) is usually made by at least one copper clad laminate and at least one electronic component. A copper clad laminate includes a polyimide film and at least one copper foil attached to the surface of the polyimide film. The dielectric constant of the polyimide film is important as a factor in impedance matching. Impedance matching can guarantee high frequency signal at a high speed. In order to realize high speed transfer of high frequency signal, an impedance matching material having a low dielectric constant is needed.

BRIEF DESCRIPTION OF THE DRAWINGS

Implementations of the present disclosure will now be described, by way of example only, with reference to the attached figures.

DETAILED DESCRIPTION

Figure 1:
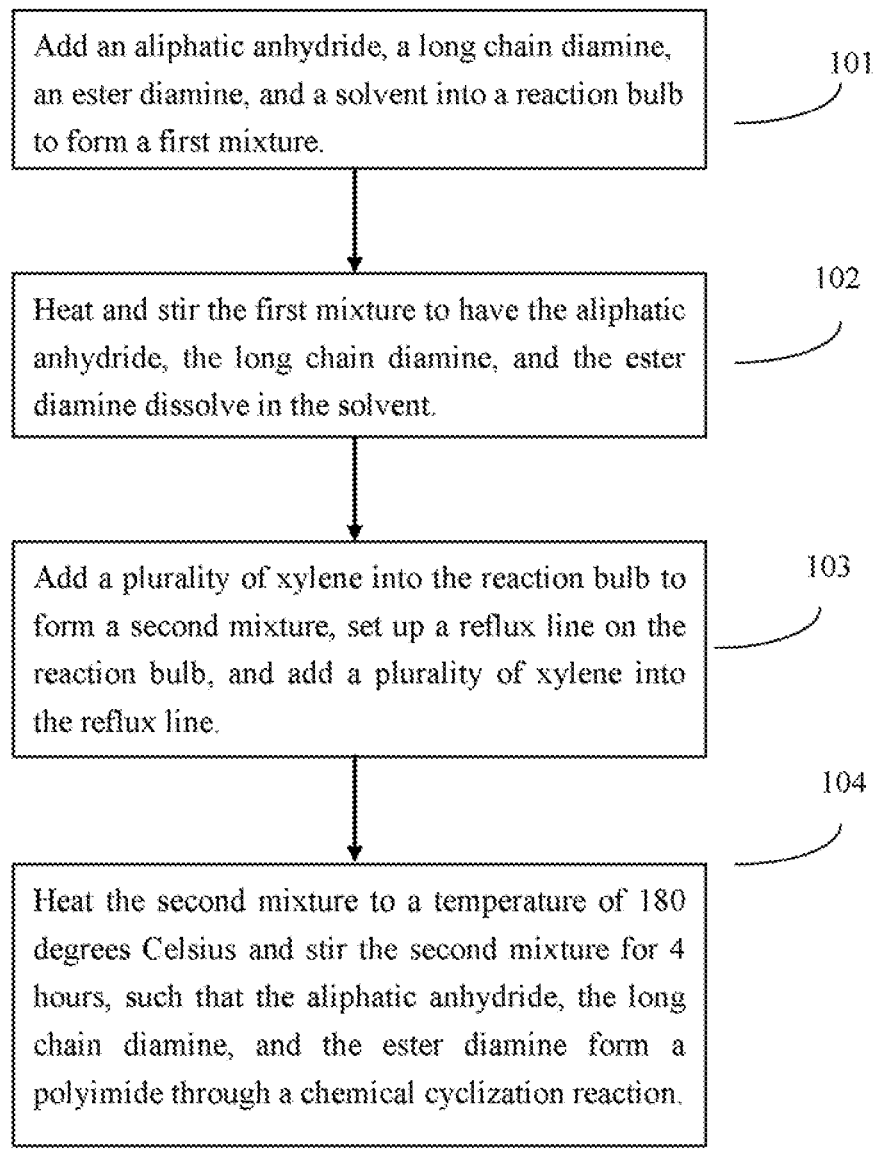
FIG. 1 is a flowchart of a method for making a polyimide in accordance with an exemplary embodiment.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like.

In an exemplary embodiment, a low dielectric polyimide composition comprises an aliphatic anhydride, a long chain diamine, and an ester diamine.

In at least one exemplary embodiment, the low dielectric polyimide composition comprises about 1 to about 20 molar parts of the aliphatic anhydride, about 1 part to about 10 molar parts of the long chain diamine, and about 0.1 to about 0.5 molar parts of the ester diamine.

The aliphatic anhydride may be selected from Bicyclo [2.2.2]oct-7-ene-2,3,5,6-tetracaroxylic acid dianhydride (BTA), Tetrahydro-5,9-methano-1H-pyrano[3,4-d] oxepin-1,3,6,8(4H)-tetrone (3-(Carboxymethyl)-1,2,4-cyclopentanetricarboxylic acid 1,4:2,3-dianhydride, TCA), 1,2,3,4-Cyclopentanetetracarboxylic aciddianhydride (CPDA), or any combination thereof.

A chemical structure formula of the BTA is:

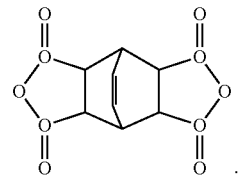

A chemical structure formula of the TCA is:

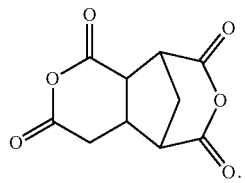 [SMILES: O=C1CC2C3CC(C(=O)OC3=O)C2C(=O)O1]

A chemical structure formula of the CPDA is:

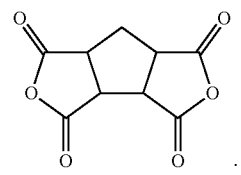 [SMILES: O=C1OC(=O)C2C1CC1C(=O)OC(=O)C12]

The long chain diamine may be selected from [Bis (3-aminopropy)]polydimethylsiloxane (KF8010), 2,2-Bis [4-(4-aminophenoxy)phenyl]hexafluoropropane (HF-BAPP), amino-terminated polyoxypropylene (O,O'-Bis(2-aminopropyl)polypropyleneglycol, OOBP), or any combination thereof.

A chemical structure formula of the KF8010 is:

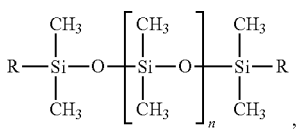

wherein, the R is an organic group.

A chemical structure formula of the HFBAPP is:

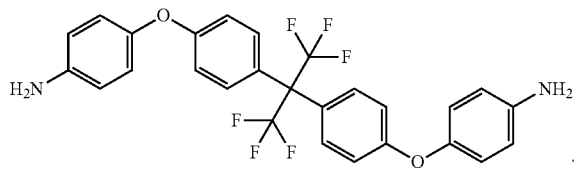 [SMILES: Nc1ccc(Oc2ccc(C(c3ccc(Oc4ccc(N)cc4)cc3)(C(F)(F)F)C(F)(F)F)cc2)cc1]

A chemical structure formula of the OOBP is:

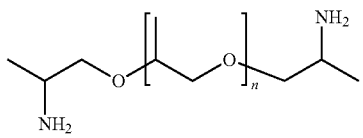

The ester diamine may be selected from 4-Aminobenzoic acid 4-aminophenyl ester (APAB), 1,4-Bis(4-aminobenzoyloxy)benzene (ABHQ), or combination thereof.

A chemical structure formula of the APAB is:

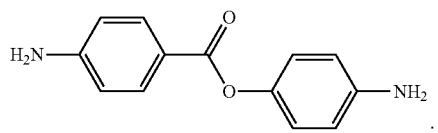

A chemical structure formula of the ABHQ is:

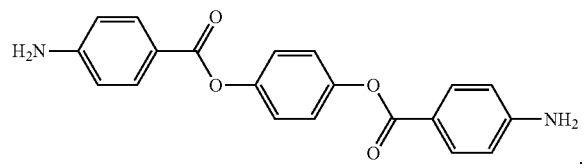

In an exemplary embodiment, a polyimide is a cyclized product of the low dielectric polyimide composition. In other words, the polyimide is a cyclized product of the aliphatic anhydride, the long chain diamine, and the ester diamine.

The polyimide has a dielectric constant ($D_k$) that is less than 3.0, and the polyimide has a dielectric loss ($D_f$) that is less than 0.01.

The polyimide has a viscosity of about 2000 CPS to about 5000 CPS.

The polyimide is a thermoplastic polyimide.

A chain link of the polyimide has at least one low polarizability group, such as C—C (carbon carbon single bond), or C—H (hydrocarbon single bond), thus the dielectric constant of the polyimide is low. The polyimide also has a high heat resistance, a high chemical resistance, a high mechanical strength, and a high electrical impedance.

FIG. 1 illustrates a flowchart of a method for making the polyimide in accordance with an exemplary embodiment. The exemplary method is provided by way of example, as there are a variety of ways to carry out the method. Each block shown in the figure represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method may begin at block 101.

At block 101, an aliphatic anhydride, a long chain diamine, an ester diamine, and a solvent are added into a reaction bulb to form a first mixture.

The solvent may be selected from dimethyl formamide (DMF), dimethyl acetamide (DMAC), N-Methylpyrrolidone (NMP), dimethyl sulfoxide (DMSO), or any combination thereof. The amount of the solvent may be adjusted, ensuring that all the above components are dissolved in the solvent.

At block 102, the first mixture is heated and stirred to have the aliphatic anhydride, the long chain diamine, and the ester diamine dissolved in the solvent.

In at least one exemplary embodiment, the first mixture is heated at a temperature of 80 degrees Celsius, and stirred for 4 hours.

At block 103, a plurality of xylene is added into the reaction bulb to form a second mixture, a reflux line is set up on the reaction bulb, and a plurality of xylene is added into the reflux line.

At block 104, the second mixture is heated to a temperature of 180 degrees Celsius and stirred for 4 hours, such that the aliphatic anhydride, the long chain diamine, and the ester diamine form a polyimide through a chemical cyclization reaction.

Figure 7:
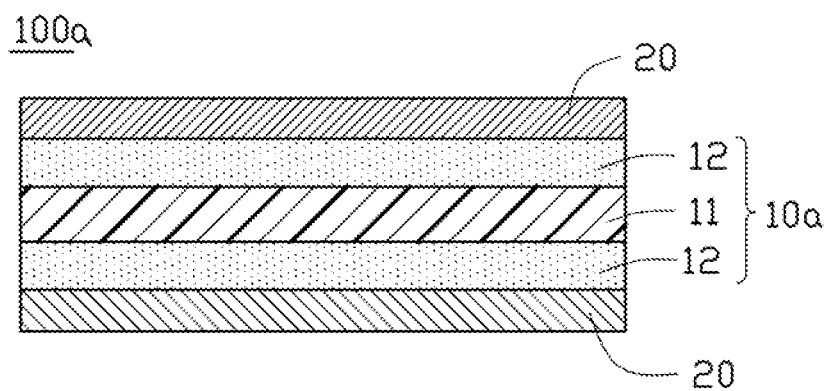

FIG. 7 illustrates a first exemplary embodiment of a copper clad laminate 100a including a substrate 10a, and two copper foils 20 secured to opposite surfaces of the substrate 10a. The substrate 10a includes an insulating layer 11, and two polyimide films 12 secured to opposite surfaces of the insulating layer 11. Each of the two copper foils 20 is attached to a surface of one of the two polyimide films 12 away from the insulating layer 11. The polyimide film 12 is formed by coating the polyimide on a surface of the insulating layer 11, then baking or drying the polyimide.

In at least one exemplary embodiment, the insulating layer 11 is made of polyimide.

Figure 2:
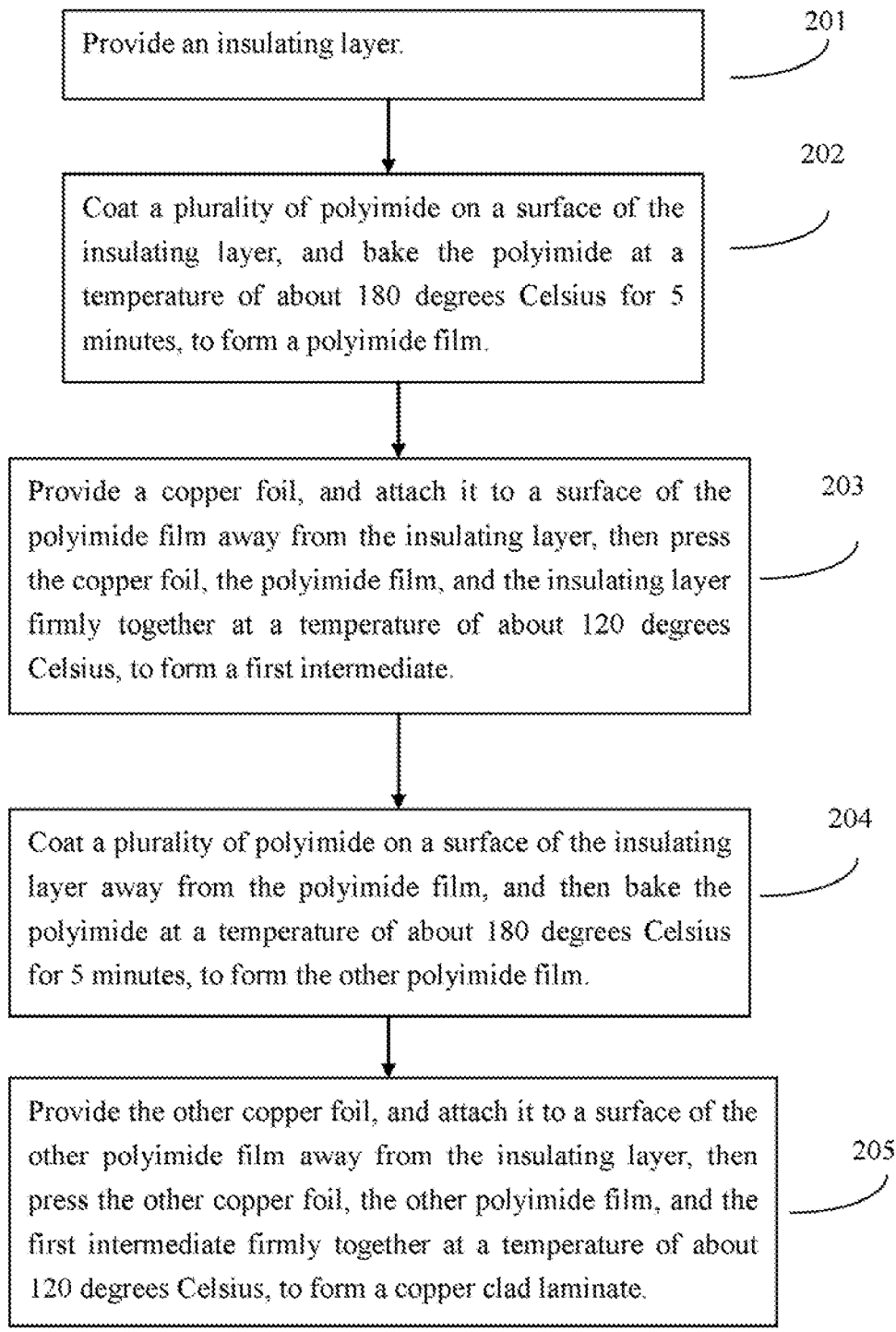
FIG. 2 is a flowchart of a method for making a copper clad laminate in accordance with a first exemplary embodiment.

FIG. 2 illustrates a flowchart of a method for making the copper clad laminate 100a in accordance with an exemplary embodiment. The exemplary method is provided by way of example, as there are a variety of ways to carry out the method. Each block shown in the figure represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method may begin at block 201.

Figure 3:
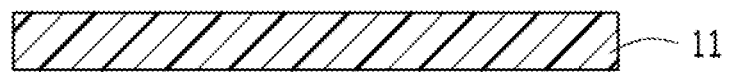
FIGS. 3-7 show a first exemplary embodiment of making a copper clad laminate in accordance with the present disclosure.

At block 201, referring to FIG. 3, an insulating layer 11 is provided.

Figure 4:

At block 202, referring to FIG. 4, a certain amount of polyimide is coated on a surface of the insulating layer 11, and then baked at a temperature of about 180 degrees Celsius for 5 minutes, to form a polyimide film 12.

Figure 5:
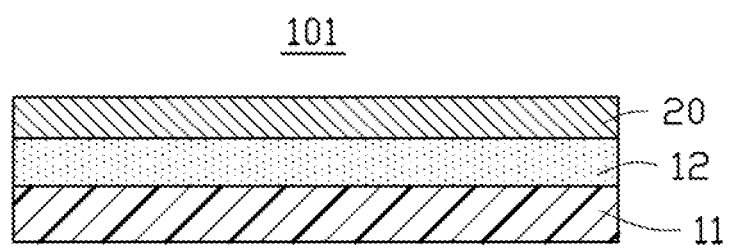

At block 203, referring to FIG. 5, a copper foil 20 is provided, and the foil 20 is attached to a surface of the polyimide film 12 away from the insulating layer 11. The copper foil 20, the polyimide film 12, and the insulating layer 11 are then pressed firmly together at a temperature of about 120 degrees Celsius, to form a first intermediate 101.

Figure 6:
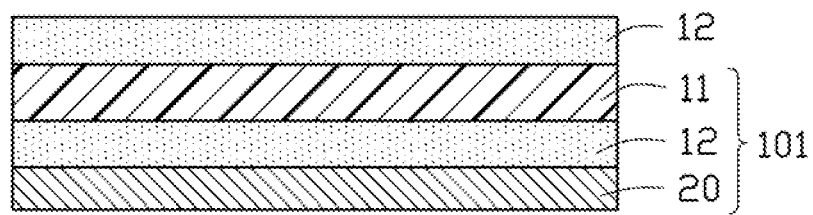

At block 204, referring to FIG. 6, polyimide is coated on a surface of the insulating layer 11 away from the polyimide film 12, and then baked at a temperature of about 180 degrees Celsius for 5 minutes, to form the other polyimide film 12.

At block 205, referring to FIG. 6 and FIG. 7, the other copper foil 20 is provided, and attached to a surface of the other polyimide film 12 away from the insulating layer 11. The other copper foil 20, the other polyimide film 12, and the first intermediate 101 are then pressed firmly together at a temperature of about 120 degrees Celsius, to form a copper clad laminate 100a.

Figure 12:
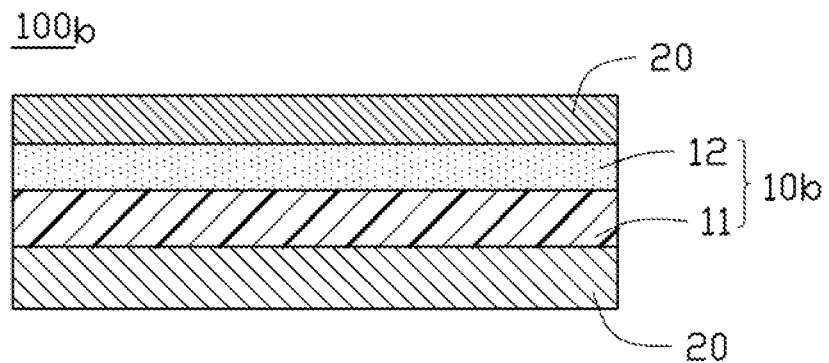

FIG. 12 illustrates a second exemplary embodiment of a copper clad laminate 100b, including a substrate 10b, and two copper foils 20 secured to opposite surfaces of the substrate 10b. The substrate 10b includes an insulating layer 11, and a polyimide film 12 attached to a surface of the insulating layer 11. One of the two copper foils 20 is attached to a surface of the insulating layer 11 away from the polyimide film 12, the other one of the two copper foils 20 is attached to a surface of the polyimide film 12 away from the insulating layer 11. The polyimide film 12 is formed by coating polyimide on a surface of the insulating layer 11, then baking or drying the polyimide.

In at least one exemplary embodiment, the insulating layer 11 is made of polyimide.

Figure 8:
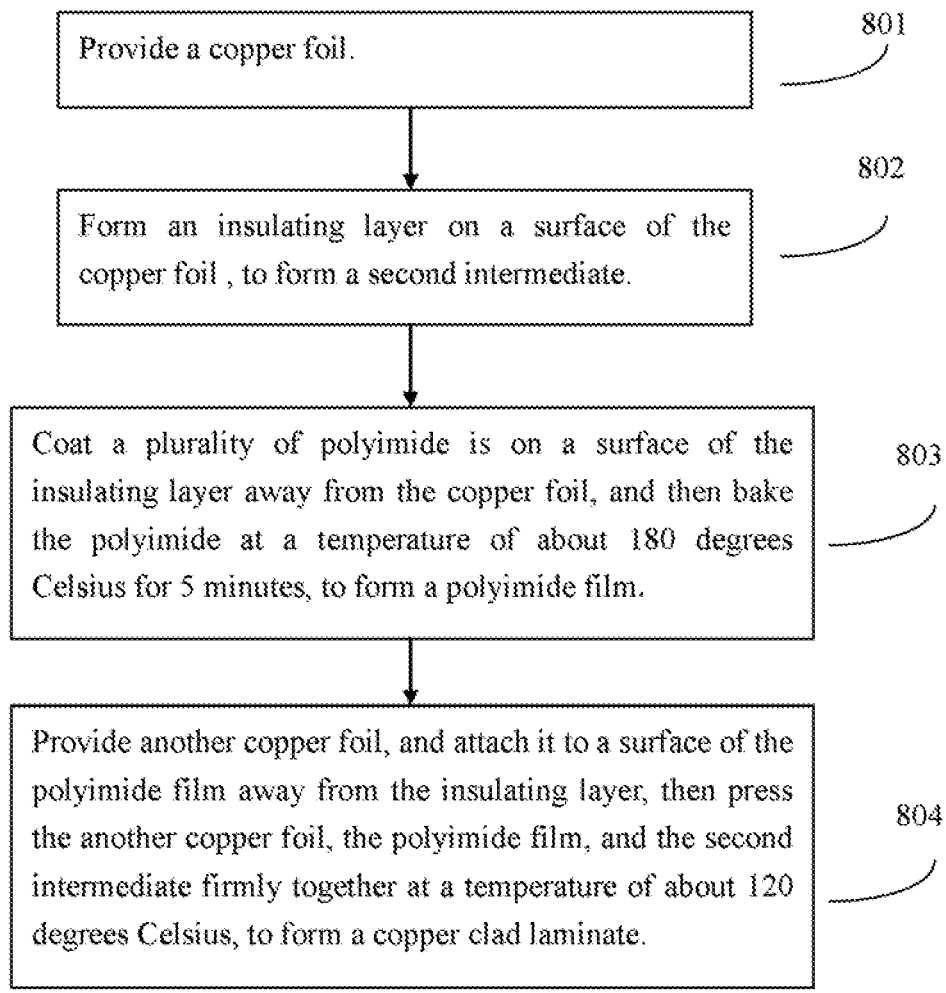
FIG. 8 is a flowchart of a method for making a copper clad laminate in accordance with a second exemplary embodiment.

FIG. 8 illustrates a flowchart of a method for making the copper clad laminate 100b in accordance with an exemplary embodiment. The exemplary method is provided by way of example, as there are a variety of ways to carry out the method. Each block shown in the figure represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method may begin at block 801.

Figure 9:
FIGS. 9-12 show a second exemplary embodiment of making a copper clad laminate in accordance with the present disclosure.

At block 801, referring to FIG. 9, a copper foil 20 is provided.

Figure 10:
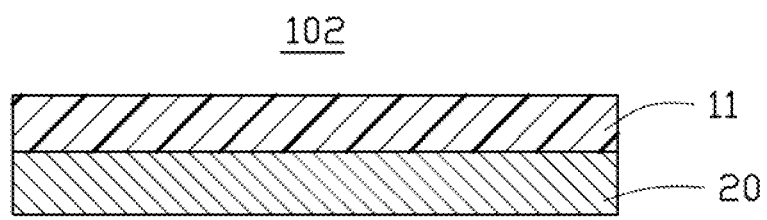

At block 802, referring to FIG. 10, an insulating layer 11 is formed on a surface of the copper foil 20, to form a second intermediate 102.

Figure 11:
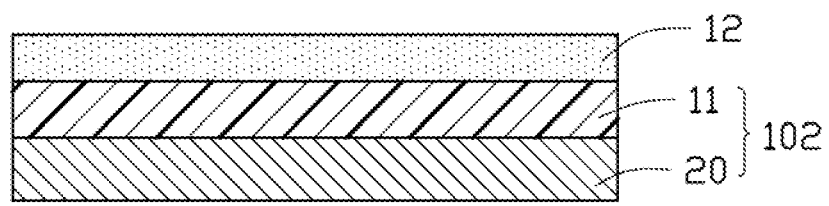

At block 803, referring to FIG. 11, polyimide is coated on a surface of the insulating layer 11 away from the copper foil 20, and then baked at a temperature of about 180 degrees Celsius for 5 minutes, to form a polyimide film 12.

At block 804, referring to FIG. 11 and FIG. 12, another copper foil 20 is provided, and attached to a surface of the polyimide film 12 away from the insulating layer 11. The another copper foil 20, the polyimide film 12, and the second intermediate 102 are then pressed firmly together at a temperature of about 120 degrees Celsius, to form a copper clad laminate 100b.

Figure 17:
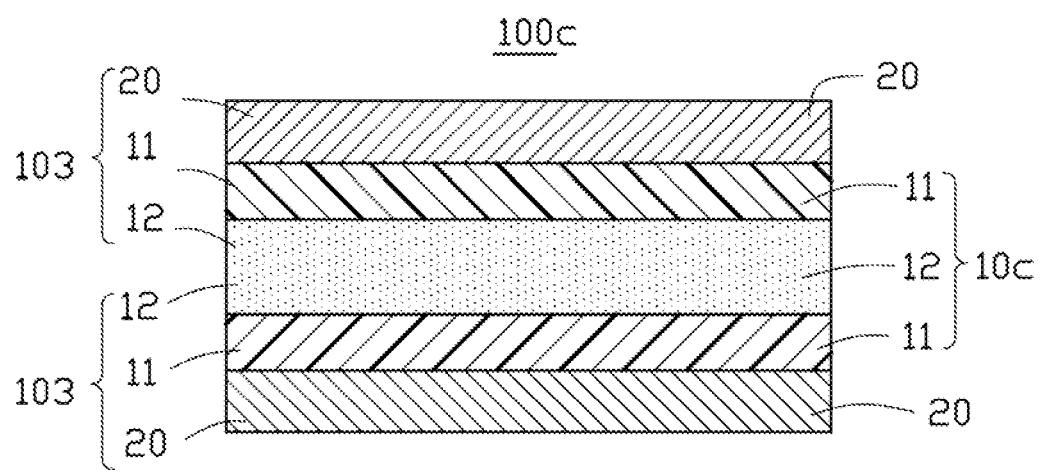

FIG. 17 illustrates a third exemplary embodiment of a copper clad laminate 100c including a substrate 10c, and two copper foils 20 secured to opposite surfaces of the substrate 10c. The substrate 10c includes a polyimide film 12, and two insulating layers 11 secured on opposite surfaces of the polyimide film 12. Each one of the two copper foils 20 is attached to a surface of one of the two insulating layers 11 away from the polyimide film 12. The polyimide film 12 is formed by coating the polyimide on a surface of the insulating layer 11, then baking or drying the polyimide.

In at least one exemplary embodiment, the insulating layer 11 is made of polyimide.

Figure 13:
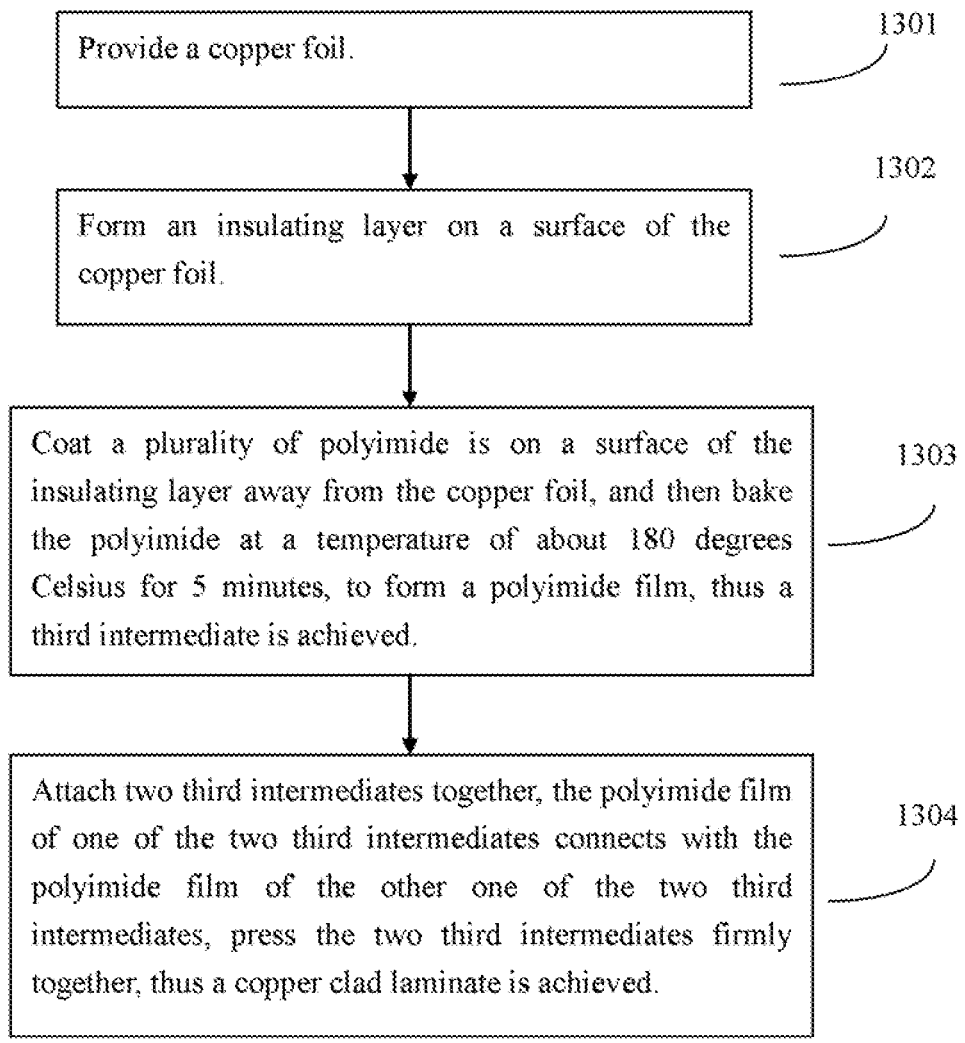
FIG. 13 is a flowchart of a method for making a copper clad laminate in accordance with a third exemplary embodiment.

FIG. 13 illustrates a flowchart of a method for making the copper clad laminate 100c in accordance with an exemplary embodiment. The exemplary method is provided by way of example, as there are a variety of ways to carry out the method. Each block shown in the figure represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method may begin at block 1301.

Figure 14:
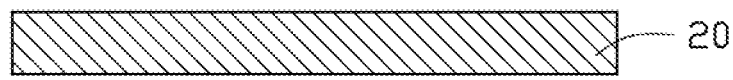
FIGS. 14-17 show a third exemplary embodiment of making a copper clad laminate in accordance with the present disclosure.

At block 1301, referring to FIG. 14, a copper foil 20 is provided.

Figure 15:
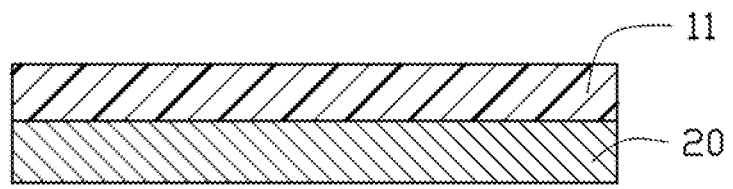

At block 1302, referring to FIG. 15, an insulating layer 11 is formed on a surface of the copper foil 20.

Figure 16:
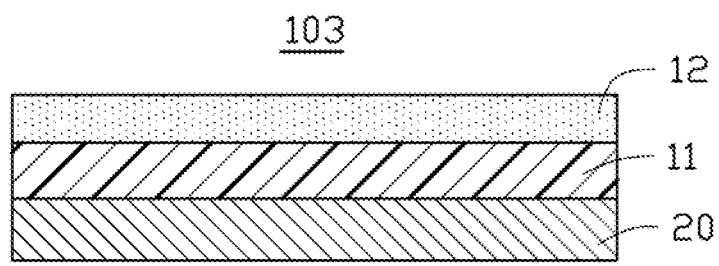

At block 1303, referring to FIG. 16, polyimide is coated on a surface of the insulating layer 11 away from the copper foil 20, and then baked at a temperature of about 180 degrees Celsius for 5 minutes, to form a polyimide film 12, thus a third intermediate 103 is achieved.

At block 1304, referring to FIG. 17, two of the third intermediate 103 are attached together, and the polyimide film 12 of one of the two third intermediates 103 is connected with the polyimide film 12 of the other one of the two third intermediates 103. The two third intermediates 103 are pressed together firmly with the two polyimide films 12 to form a polyimide film 12, thus a copper clad laminate 100c is achieved.

Example 1

BTA, KF8010, APAB, and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and xylene was added into the reflux line. The second mixture was heated to a temperature of 180 degrees Celsius and stirred for 4 hours, such that the second mixture forms a polyimide through a chemical cyclization reaction.

The molar weight of the BTA is 1.0 mol, the molar weight of the KF8010 is 0.9 mol, the molar weight of the APAB is 0.1 mol, and the mass of the NMP is 100 g.

Example 2

BTA, KF8010, ABHQ, and NMP were added to a reaction bulb to form a first mixture. The first mixture was heated to a temperature of 80 degrees Celsius, and stirred for 4 hours. Xylene was added into the reaction bulb to form a second mixture, a reflux line was set up on the reaction bulb, and xylene was added into the reflux line. The second mixture was heated to a temperature of 180 degrees Celsius and stirred for 4 hours, such that the second mixture forms a polyimide through a chemical cyclization reaction.

The molar weight of the BTA is 1.0 mol, the molar weight of the KF8010 is 0.9 mol, the molar weight of the ABHQ is 0.1 mol, and the mass of the NMP is 100 g.

Example 3

BTA, HFBAPP, APAB, and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the BTA is 1.0 mol, the molar weight of the HFBAPP is 0.9 mol, the molar weight of the APAB is 0.1 mol, and the mass of the NMP is 100 g.

Example 4

BTA, HFBAPP, ABHQ, and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the BTA is 1.0 mol, the molar weight of the HFBAPP is 0.9 mol, the molar weight of the ABHQ is 0.1 mol, and the mass of the NMP is 100 g.

Example 5

BTA, OOBP, APAB, and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the BTA is 1.0 mol, the molar weight of the OOBP is 0.9 mol, the molar weight of the APAB is 0.1 mol, and the mass of the NMP is 100 g.

Example 6

BTA, OOBP, ABHQ, and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the BTA is 1.0 mol, the molar weight of the OOBP is 0.9 mol, the molar weight of the ABHQ is 0.1 mol, and the mass of the NMP is 100 g.

Example 7

TCA, KF8010, APAB and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the TCA is 1.0 mol, the molar weight of the KF8010 is 0.9 mol, the molar weight of the APAB is 0.1 mol, and the mass of the NMP is 100 g.

Example 8

TCA, KF8010, ABHQ and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the TCA is 1.0 mol, the molar weight of the KF8010 is 0.9 mol, the molar weight of the ABHQ is 0.1 mol, and the mass of the NMP is 100 g.

Example 9

TCA, HFBAPP, APAB and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the TCA is 1.0 mol, the molar weight of the HFBAPP is 0.9 mol, the molar weight of the APAB is 0.1 mol, and the mass of the NMP is 100 g.

Example 10

TCA, HFBAPP, ABHQ and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the TCA is 1.0 mol, the molar weight of the HFBAPP is 0.9 mol, the molar weight of the ABHQ is 0.1 mol, and the mass of the NMP is 100 g.

Example 11

TCA, OOBP, APAB and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius, and stirred for 4 hours, such that the second mixture forms a polyimide through a chemical cyclization reaction.

The molar weight of the TCA is 1.0 mol, the molar weight of the OOBP is 0.9 mol, the molar weight of the APAB is 0.1 mol, and the mass of the NMP is 100 g.

Example 12

TCA, OOBP, ABHQ and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the TCA is 1.0 mol, the molar weight of the OOBP is 0.9 mol, the molar weight of the ABHQ is 0.1 mol, and the mass of the NMP is 100 g.

Example 13

CPDA, KF8010, APAB and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the CPDA is 1.0 mol, the molar weight of the KF8010 is 0.9 mol, the molar weight of the APAB is 0.1 mol, and the mass of the NMP is 100 g.

Example 14

CPDA, KF8010, ABHQ and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the CPDA is 1.0 mol, the molar weight of the KF8010 is 0.9 mol, the molar weight of the ABHQ is 0.1 mol, and the mass of the NMP is 100 g.

Example 15

CPDA, HFBAPP, APAB and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, to have the second mixture forms a polyimide through a chemical cyclization reaction.

The molar weight of the CPDA is 1.0 mol, the molar weight of the HFBAPP is 0.9 mol, the molar weight of the APAB is 0.1 mol, and the mass of the NMP is 100 g.

Example 16

CPDA, HFBAPP, ABHQ and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the CPDA is 1.0 mol, the molar weight of the HFBAPP is 0.9 mol, the molar weight of the ABHQ is 0.1 mol, and the mass of the NMP is 100 g.

Example 17

CPDA, OOBP, APAB and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the CPDA is 1.0 mol, the molar weight of the OOBP is 0.9 mol, the molar weight of the APAB is 0.1 mol, and the mass of the NMP is 100 g.

Example 18

CPDA, OOBP, ABHQ and NMP were added to a reaction bulb to form a first mixture. The first mixture was heated to a temperature of 80 degrees Celsius, and stirred for 4 hours. A plurality of xylene was added into the reaction bulb to form a second mixture, a reflux line was set up on the reaction bulb, and a plurality of xylene was added into the reflux line. The second mixture was heated to a temperature of 180 degrees Celsius and stirred for 4 hours, such that the second mixture forms a polyimide through a chemical cyclization reaction.

The molar weight of the CPDA is 1.0 mol, the molar weight of the OOBP is 0.9 mol, the molar weight of the ABHQ is 0.1 mol, and the mass of the NMP is 100 g.

A commercially available thermoplastic polyimide (KANEKA FRS-522 #SW) and a commercially available epoxy resin were provided. The polyimide in examples 1~18, the commercially available thermoplastic polyimide, and the commercially available epoxy resin were subjected to a dielectric constant ($D_k$) test and a dielectric loss ($D_f$) test. The test results are shown in table 1.

TABLE 1

|  | $D_k$ (10 GHz) | $D_f$ (10 GHz) |
| --- | --- | --- |
| Example 1 | 2.92 | 0.006 |
| Example 2 | 2.95 | 0.008 |
| Example 3 | 2.75 | 0.008 |

TABLE 1-continued

|  | $D_k$ (10 GHz) | $D_f$ (10 GHz) |
| --- | --- | --- |
| Example 4 | 2.70 | 0.007 |
| Example 5 | 2.95 | 0.006 |
| Example 6 | 2.91 | 0.009 |
| Example 7 | 2.92 | 0.006 |
| Example 8 | 2.98 | 0.009 |
| Example 9 | 2.70 | 0.007 |
| Example 10 | 2.74 | 0.009 |
| Example 11 | 2.95 | 0.007 |
| Example 12 | 2.95 | 0.009 |
| Example 13 | 2.95 | 0.007 |
| Example 14 | 2.97 | 0.009 |
| Example 15 | 2.83 | 0.008 |
| Example 16 | 2.85 | 0.009 |
| Example 17 | 2.94 | 0.009 |
| Example 18 | 2.98 | 0.009 |
| Commercially available thermoplastic polyimide | 3.2 | 0.008 |
| Commercially available epoxy resin | 3.5 | 0.02 |

Table 1 illustrates that the dielectric constant of the polyimides in the above examples 1~18 are lower than the dielectric constant of the commercially available thermoplastic polyimide. The dielectric constant and the dielectric loss of the polyimides in the above examples 1~18 are lower than the dielectric constant and the dielectric loss of the commercially available epoxy resin.

A copper foil (JX BHFX Type) with a thickness of 12 μm, and an insulating layer (commercially available polyimide film, SKC GF Type) with a thickness of 25 μm were provided. Six copper clad laminates 100a were made by the polyimide in examples 1, 4, 7, 10, 13, 16. Six copper clad laminates 100b were made by the polyimide in examples 2, 5, 8, 11, 14, 17. Six copper clad laminates 100c were made by the polyimide in examples 3, 6, 9, 12, 15, 18. A copper clad laminate A having the same structure as the copper clad laminate 100a was made by the commercially available thermoplastic polyimide. A copper clad laminate B having the same structure with the copper clad laminate 100c was made by the commercially available thermoplastic polyimide. A copper clad laminate having the same structure with the copper clad laminate 100c was made by the commercially available epoxy resin.

The copper clad laminates were subjected to a peel strength test, and a solder float resistance test. The test results are shown in table 2.

The solder float resistance test was carried out by forming solder masks on the surface of the polyimide film, then exposing the copper clad laminates to a temperature equal to or greater than 288 degrees Celsius for 10 seconds, and observing whether the solder masks were peeled off or dropped from the copper clad laminates.

TABLE 2

|  | Peel Strength ((kgf/cm)) | Solder Float Resistance |
| --- | --- | --- |
| Copper clad laminate made by polyimide of example 1 | 1.02 | 288 degrees Celsius for 10 seconds Not peeled off |
| Copper clad laminate made by polyimide of example 2 | 0.95 | 288 degrees Celsius for 10 seconds Not peeled off |
| Copper clad laminate made by polyimide of example 3 | 0.89 | 320 degrees Celsius for 10 seconds Not peeled off |
| Copper clad laminate made by polyimide of example 4 | 0.81 | 320 degrees Celsius for 10 seconds Not peeled off |
| Copper clad laminate made by polyimide of example 5 | 0.94 | 288 degrees Celsius for 10 seconds Not peeled off |
| Copper clad laminate made by polyimide of example 6 | 0.92 | 288 degrees Celsius for 10 seconds Not peeled off |
| Copper clad laminate made by polyimide of example 7 | 0.97 | 288 degrees Celsius for 10 seconds Not peeled off |
| Copper clad laminate made by polyimide of example 8 | 0.91 | 288 degrees Celsius for 10 seconds Not peeled off |
| Copper clad laminate made by polyimide of example 9 | 0.88 | 320 degrees Celsius for 10 seconds Not peeled off |
| Copper clad laminate made by polyimide of example 10 | 0.81 | 320 degrees Celsius for 10 seconds Not peeled off |
| Copper clad laminate made by polyimide of example 11 | 0.97 | 288 degrees Celsius for 10 seconds Not peeled off |
| Copper clad laminate made by polyimide of example 12 | 0.95 | 288 degrees Celsius for 10 seconds Not peeled off |
| Copper clad laminate made by polyimide of example 13 | 1.13 | 288 degrees Celsius for 10 seconds Not peeled off |
| Copper clad laminate made by polyimide of example 14 | 1.05 | 288 degrees Celsius for 10 seconds Not peeled off |
| Copper clad laminate made by polyimide of example 15 | 0.78 | 320 degrees Celsius for 10 seconds Not peeled off |
| Copper clad laminate made by polyimide of example 16 | 0.75 | 320 degrees Celsius for 10 seconds Not peeled off |
| Copper clad laminate made by polyimide of example 17 | 0.85 | 288 degrees Celsius for 10 seconds Not peeled off |
| Copper clad laminate made by polyimide of example 18 | 0.89 | 288 degrees Celsius for 10 seconds Not peeled off |
| Copper clad laminate A made by the commercially available thermoplastic polyimide | 1.12 | 320 degrees Celsius for 10 seconds Not peeled off |
| Copper clad laminate B made by the commercially available thermoplastic polyimide | 0.96 | 320 degrees Celsius for 10 seconds Not peeled off |

TABLE 2-continued

| | Peel Strength ((kgf/cm)) | Solder Float Resistance |
|---|---|---|
| Copper clad laminate made by the commercially available epoxy resin | 0.93 | 288 degrees Celsius for 10 seconds Not peeled off |

Table 2 illustrates that the copper clad laminates made by the polyimides in examples 1~18 have approximately the same peel strength and solder float resistance as the copper clad laminates made by the commercially available thermoplastic polyimide and the commercially available epoxy resin.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A copper clad laminate comprising:
a copper foil; and
a substrate secured to a surface of the copper foil, the substrate comprising at least one insulating layer and at least one polyimide film attached to a surface of the at least one insulating layer, the polyimide film comprising:
a polyimide that is a cyclized product consisting of:
an aliphatic anhydride selected from the group consisting of bicyclo[2.2.2]oct-7-ene-2,3,5,6-tetracarboxylic acid dianhydride, tetrahydro-5,9-methano-1H-pyrano[3,4-d] oxepin-1,3,6,8(4H)-tetrone, 1,2,3,4-cyclopentanetetracarboxylic acid dianhydride, and any combination thereof;
a long chain diamine selected from the group consisting of [bis(3-aminopropyl)]polydimethylsiloxane, 2,2-bis[4-(4-aminophenoxy)phenyl]hexafluoropropane, amino-terminated polyoxypropylene, and any combination thereof; and
an ester diamine;
wherein the amount of the aliphatic anhydride is 1 to 20 molar parts, the amount of the long chain diamine is 1 to 10 molar parts, and the amount of the ester diamine is 0.1 to 0.5 molar parts, and
the polyimide has a dielectric constant less than 2.98 and a dielectric loss less than 0.009.

* * * * *